(12) United States Patent
Bourdelle et al.

(10) Patent No.: US 7,767,545 B2
(45) Date of Patent: Aug. 3, 2010

(54) SUBSTRATE PRODUCTION METHOD AND SUBSTRATE INCLUDING AMORPHIZATION AND RECRYSTALLIZING A TOP REGION

(75) Inventors: Konstantin Bourdelle, Crolles (FR); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 49 days.

(21) Appl. No.: 11/910,104

(22) PCT Filed: Mar. 29, 2006

(86) PCT No.: PCT/EP2006/061142
§ 371 (c)(1), (2), (4) Date: May 2, 2008

(87) PCT Pub. No.: WO2006/103256
PCT Pub. Date: Oct. 5, 2006

(65) Prior Publication Data
US 2008/0303061 A1 Dec. 11, 2008

(30) Foreign Application Priority Data
Mar. 31, 2005 (FR) ..................... 05 03174

(51) Int. Cl.
*H01L 21/46* (2006.01)
*H01L 21/04* (2006.01)
(52) U.S. Cl. ....................... 438/458; 438/510

(58) Field of Classification Search ................ 438/458, 438/510; 257/E21.568, E21.334, E29.084
See application file for complete search history.

(56) References Cited

U.S. PATENT DOCUMENTS

| 2003/0172866 | A1 | 9/2003 | Hsu et al. ...................... 117/40 |
| 2004/0009626 | A1 | 1/2004 | Tweet et al. ................... 438/93 |
| 2004/0150006 | A1* | 8/2004 | Aulnette et al. ............. 257/200 |

OTHER PUBLICATIONS

T.Sameshima et al, XP-002341997, "Pulsed laser-induced crystallization and amorphization of SiGe films", Mat. REs. Soc. Symp. Proc. vol. 258, pp. 117-122 (1992).

* cited by examiner

*Primary Examiner*—William M. Brewster
(74) *Attorney, Agent, or Firm*—Winston & Strawn LLP

(57) ABSTRACT

A process for the manufacture of a substrate having a top layer of a first material and an underlying layer of a second material whose lattice parameter is different from that of the first material. The process includes the steps of conducting an amorphization of the top layer to create an amorphous region in the top layer lying between an exposed surface and an amorphization interface, with that portion of the top layer below the interface being shielded from the amorphization and remaining as a crystalline structure; recrystallizing the amorphous region while also creating a network of defects at the interface, wherein the network forms a boundary for dislocations from the crystalline structure of the top layer, and containing the dislocations in the portion of the top layer that is located below the interface. Also, the substrates obtained by the method.

20 Claims, 3 Drawing Sheets

SiGe 20% épitaxié
RMS : 32 Å
PV : 212 Å

SUBSTRATE PRODUCTION METHOD AND SUBSTRATE INCLUDING AMORPHIZATION AND RECRYSTALLIZING A TOP REGION

This application is a 371 of PCT/EP2006/061142 filed Mar. 29, 2006.

FIELD OF THE INVENTION

In general, this present invention concerns the processing of materials, and more particularly of substrates for electronic, optical or opto-electronic use.

BACKGROUND OF THE INVENTION

More precisely, the invention concerns a process for the manufacture of a substrate that includes a top layer in a first material and an underlying layer in a second material whose lattice parameter is different from the lattice parameter of the first material.

In one example of implementation of the invention, the first material is relaxed SiGe or Ge. In this example, the second material is Si, whose lattice parameter is different from the lattice parameter of the layer of first material (SiGe or Ge).

Still in this example, the top relaxed SiGe or Ge layer is generally separated from the layer of Si by a transition layer in which the lattice parameter changes in a continuous manner between these two layers. A transition layer in SiGe, in which the concentration of Ge and therefore the lattice parameter changes according to a gradient when one passes through the layer in the direction of its thickness is an example of such a transition layer. The concentration of Ge can reach a value that is typically between 20% to 100%.

It should be noted that these examples of first and second materials do not limit the invention.

Returning however to the type of substrate mentioned above, the invention thus applies in a particularly advantageous manner to the manufacture of a substrate that comprises a top layer in relaxed SiGe (or Ge) and an underlying layer in SiGe which thus plays the role of a transition layer between the top layer and a support layer (in Si, for example).

Such a substrate is represented in FIG. 1.

This substrate (10) includes a support layer (100) in Si, a top layer (120) in SiGe (SiGe with 20% of Ge, for example,— which will be referred to as SiGe 20%), and a transition layer (110) in which the concentration of Ge increases from 0% (at the contact with the support layer) to 20% (at the contact with the top layer).

As we will see, the invention also concerns a substrate that is obtained by a process such as that mentioned above. Such a substrate according to the invention can in particular be of the general type shown in FIG. 1 (where the proportions of Ge can be different from those that have just been mentioned concerning the example in this figure).

Processes such as those mentioned above are already known.

It is thus possible to obtain substrates such as that represented in FIG. 1, for example.

We also know about then covering the top layer, in which the concentration in Ge is constant, with a layer of strained Si (sSi).

However, the known processes are associated with some limitations.

A first limitation concerns the presence of defects of the dislocation type and their agglomerates (commonly called "pile-ups",) in the top layer. It is thus difficult to obtain layers that have dislocation densities of less than $1^E5$-$1^E6$ #/cm2 and "pile-up" densities of less than 5-20 cm /cm2.

These defects affect the crystalline structure of the top layer, and alter its quality. The dislocations are also liable to propagate through the whole thickness of the layer.

A second limitation concerns the surface state of the top layer.

In fact at the surface of the layers such as layer 120 in FIG. 1, one sees a topology of average roughness ("peak to valley" factor), which results from stresses in the thickness of the top layer.

This surface state is commonly referred to as "crosshatching".

This crosshatching can be characterised by Atomic Force Microscopy, in the case of a relaxed SiGe layer 20% (meaning one with 20% of Ge), by a roughness of the order of 30 angstroms RMS and 200 angstroms ("Peak to Valley" or PV roughness) for scanned surfaces of 40*40 microns. FIG. 2 illustrates such a surface state.

Thus, the known processes are associated in particular with two drawbacks, namely defects of the dislocation type, and crosshatching.

Techniques that aim to avoid at least one of these drawbacks are known. These techniques will be described below, here again returning to the example of a substrate whose top layer is in SiGe.

A first technique consists in treating the surface of the substrate by chemical-mechanical polishing CMP, and then causing again SiGe to grow on the polished surface.

According to this technique, the creation of the substrate is interrupted during the growth of the relaxed SiGe layer in order to execute a stage of rectification by CMP of the surface state of the SiGe layer that has already been constituted, thus reducing the roughness. After the CMP stage, the growth of the relaxed SiGe layer resumes.

It would appear that this roughness elimination stage results, during later growth, in favouring the slippage and the disappearance of the dislocations within the relaxed SiGe layer.

A second technique consists in subjecting the substrate to an annealing process, and then to an CMP stage, once the said substrate has been constituted.

The annealing is conducted at high temperature (more than 900° C., for 2 hours).

This can favour stabilisation of the substrate and dissipation of the residual stress in the relaxed SiGe layer.

The later CMP treatment is then applied to rectify the surface state of the layer.

A third technique consists in increasing the thickness of the transition layer that is positioned between the top SiGe layer and the support layer.

This is used to change the lattice parameter of this transition layer in a very progressive manner—typically by adopting a Ge concentration gradient that is lower than the one that would be adopted in the absence of dislocation risk.

It is possible that the techniques described above might provide a solution to the drawbacks mentioned earlier.

However, the implementation of these techniques involves stages that render the process complex and/or costly.

It is also said, concerning the advantages to be gained from using CMP, that it as been observed that even after planarisation (that is flattening or smoothing) of a surface by CMP, crosshatching could re-appear during later stages of the treatment to which the substrate was subjected, after transfer or after a simple thermal treatment for example.

This suggests the crosshatching is the expression of a complex phenomenon at the crystalline level and occurring in the thickness of the layer, a phenomenon which was not treated by the techniques described above.

It therefore appears that the known processes are associated with some limitations.

The aim of the invention is to enable these limitations to be overcome.

SUMMARY OF THE INVENTION

In order to reach this objective, the invention proposes, according to a first aspect, a process for the manufacture of a substrate that comprises a top layer in a first material and an underlying layer in a second material, whose lattice parameter is different from the lattice parameter of the first material, characterised in that:

the said process comprises:
- a stage for amorphisation of the top layer, so as to create, in the said top layer, an amorphous region lying between the surface of the top layer and an amorphisation interface, with the crystalline structure of the region of the top layer that is located below the said interface being shielded from the said amorphisation,
- a stage for recrystallisation of the said amorphised region,
- the recrystallisation stage allows the creation of a network of defects, at the said interface,
- with the said network forming a boundary for the dislocations of the crystalline structure of the top layer and allowing containment of the said dislocations in the region of the top layer that is located below the said interface.

Preferred non-limiting aspects of this process are as follows:
- the said amorphisation interface forms a constant depth in the thickness of the said top layer,
- the said amorphisation is effected by the implantation of species in the said top layer,
- the said top layer is in SiGe,
- the said implantation is achieved by implanting ions of Si or of Ge,
- the said implantation includes several successive stages of implantation during which the implantation energy is reduced progressively
- the said top layer is in SiGe 20%, and the implantation is effected at ambient temperature and includes three stages of implantation effected with the following energies and doses:
    stage 1: 250 keV/$10^E15$,
    stage 2: 150 keV/$5.10^E14$,
    stage 3: 50 keV/$10^E15$.
- the said amorphisation is achieved by exposure of the said top layer to a pulsed laser beam,
- the pulses of the laser have a length of a few nanoseconds,
- the said amorphisation is achieved by exposure of the said top layer to electron radiation,
- the recrystallisation stage includes a thermal treatment of the top layer,
- the said thermal treatment is conducted at a temperature of 500 to 600° C. for between a few tens of seconds and several hours,
- the said top layer is in Ge,
- the said top layer is between 500 angstroms and 3 microns.

According to a second aspect, the invention also proposes the application of a process, such as that mentioned above, to the manufacture of a multilayer structure by transfer of at least a part of the said top layer onto a receiving substrate.

Preferred but not limiting aspects of such an application are as follows:
- the said transfer is performed according to a method of the Smart-Cut™ type, and the amorphisation stage is carried out so that the depth of the said amorphisation interface in the top layer is equal to or greater than the final thickness desired for the transferred layer.

The invention also proposes a substrate that comprises a top layer in SiGe and an underlying transition layer, characterised in that the crosshatching is 2.4 angstroms RMS and 17 angstroms PV, for a scanning zone of 40*40 microns.

Finally, the invention proposes a substrate that comprises a top layer in SiGe and an underlying transition layer, characterised in that the density in the said top layer is a few units of cm/cm2 for the pile-up and $1^E4$ to $1^E5$ for the dislocations.

BRIEF DESCRIPTION OF THE DRAWINGS

Other aspects, aims and advantages of the invention will appear more clearly on reading the following description of the invention, which is provided with reference to the appended drawings in which.

DETAILED DESCRIPTION OF THE PREFERRED EMBODIMENTS

This description uses the example of a substrate whose top layer is in SiGe (SiGe 20% for example), and the substrate layer is in Si. Note however that this example in no way limits the invention.

The invention therefore relates to the manufacture of any substrate that comprises a top layer in a first material and an underlying layer in a second material, whose lattice parameter is different from the lattice parameter of the first material.

And in the case of the process according to the invention, the manufacture of the substrate comprises:
- a stage for amorphisation of the top layer, so as to create in the said top layer an amorphous region lying between the surface of the top layer and an amorphisation interface, with the crystalline structure of the region of the top layer that is located below the said interface being shielded from the said amorphisation,
- a stage for recrystallisation of the said amorphised region.

Figure 3:
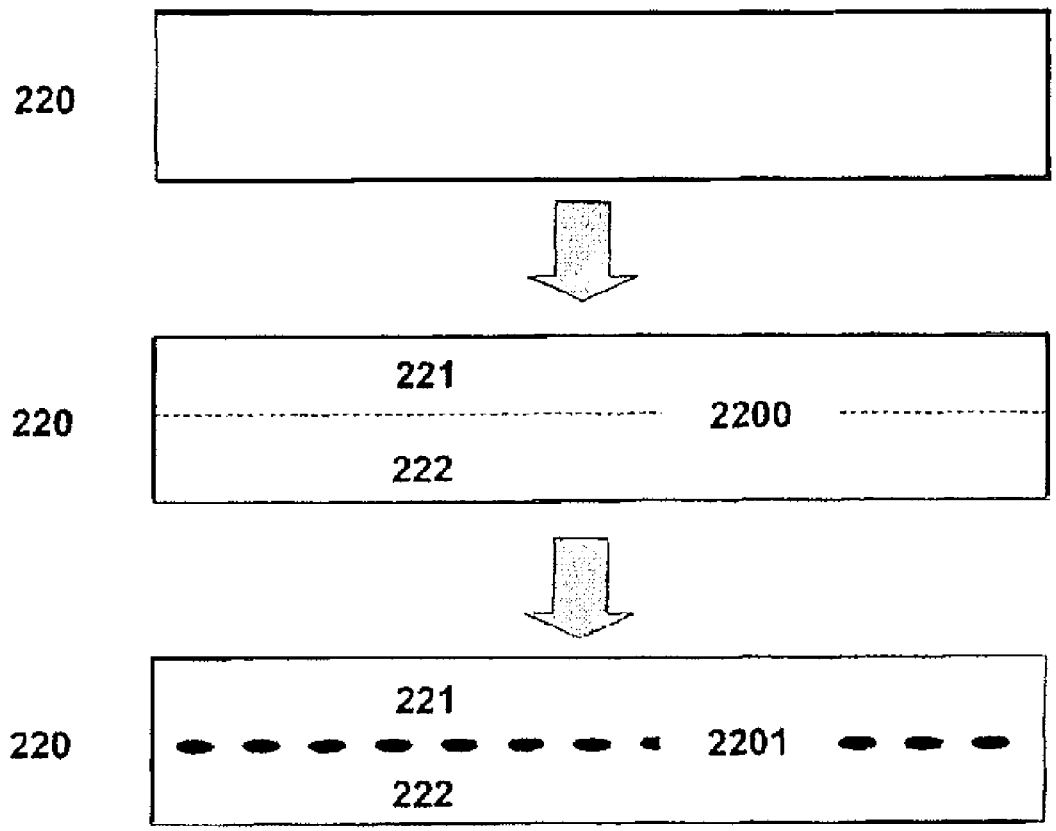
FIG. 3 schematically illustrates two stages of the process according to the invention.

These two stages are illustrated schematically in FIG. 3.

Figure 1:
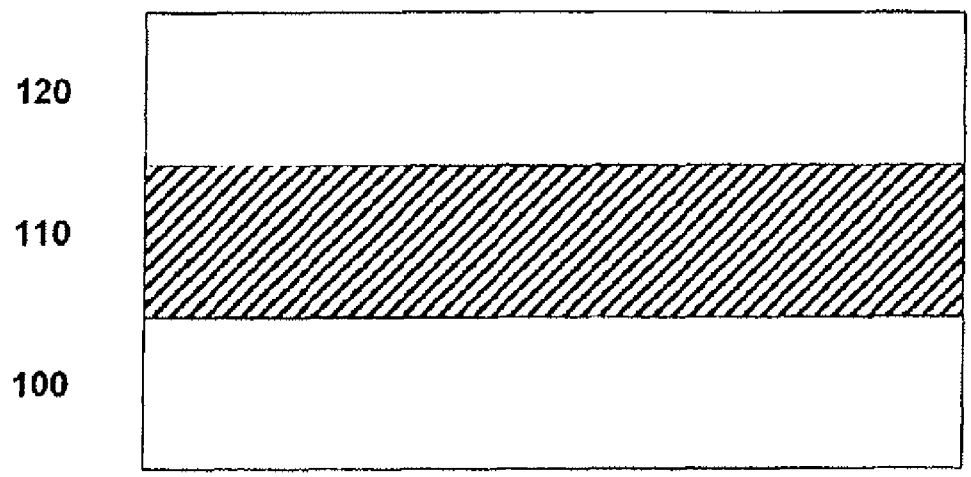
FIG. 1 is an illustration of a prior art substrate.
Figure 2:
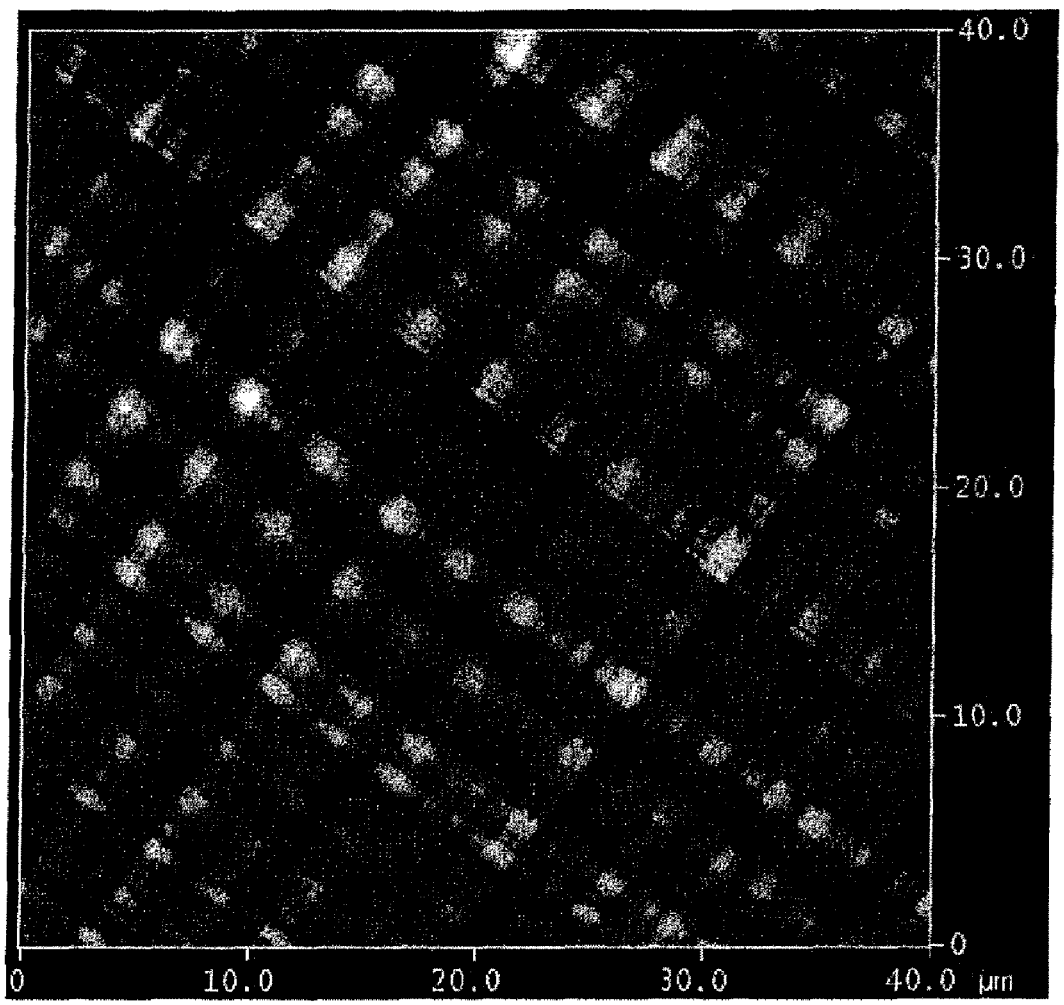
FIG. 2 is a photograph of a scanned surface of a relaxed SiGe 20% layer.

This figure only shows the top layer of the substrate (this layer is referenced 220 and corresponds, for example, to layer 120 in FIG. 1).

Layer 220 is represented in its initial state (in the top part of FIG. 3).

In this initial state, this layer can comprise dislocations (not shown), due to the presence of the underlying layer (also not shown).

The stage of amorphisation of this top layer 220 allows the creation, in this layer, of an amorphous region 221 lying between the surface of the top layer and an amorphisation interface 220. Note that what is means by "amorphous" is the state of a solid characterised by the absence of crystalline order.

This is illustrated in the middle part of FIG. 3.

For its part, the crystalline structure of the region 222 of the top layer that is located below the said interface is shielded from the amorphisation process.

The amorphisation interface corresponds in the layer 220 to the limit of depth to which the amorphisation produces its effects (i.e. amorphises the structure of the top layer)

This amorphisation interface typically forms a constant depth in the thickness of the top layer 220.

Amorphisation can be effected in particular by the implantation of species in the top layer.

In general, the nature of the ions, the dose implanted, and the implantation temperature will be chosen so as to provoke the amorphisation of a part of the layer, The implanted species can be ions of Si or of Ge. This is applicable in particular to the case of a top layer in SiGe or in Ge, since such ions will not modify the nature of this layer.

Implantation can include several successive stages of implantation during which the implantation energy is reduced progressively.

In one example of implementation of the invention, the top layer 220 is in SiGe 20%, and the implantation includes three successive stages of implantation effected with the following energies and doses, at ambient temperature (i.e. about 20-25° C.)

stage 1: 250 keV/$10^E15$,
stage 2: 150 keV/$5.10^E14$
stage 3: 50 kev/$10^E15$.

Alternatively, amorphisation can be achieved by exposure of the top layer to a pulsed laser beam.

The pulses of the laser typically have a length of a few nanoseconds.

It is also possible to perform the amorphisation by exposure of the top layer 220 to an electron radiation.

The bottom part in FIG. 3 illustrates the effects of the recrystallisation stage that follows the amorphisation stage.

This recrystallisation stage allows the creation, at the amorphisation interface, of a network of defects 2201 (such as dislocation loops), between regions 221 and 222.

This network forms a boundary in the thickness of the layer 220 for the dislocations of the crystalline structure of the top layer.

It has been said that layer 220 could contain dislocations in its initial state.

The amorphisation stage allowed the elimination of such dislocations from region 221, which has been amorphised.

For its part, region 222 can contain dislocations on completion of the amorphisation and recrystallisation stages.

Beyond elimination of the dislocations from region 221 at the moment of the amorphisation, the invention allows prevention of the re-appearance of dislocations in this region 221.

The network of defects 2201 in fact allows containment of the dislocations in region 222 of the top layer.

The defects in network 2201 are defects of the End Of Range (EOR) type.

These defects result typically from the recrystallisation stage.

For more details on such defects, reference can be made to the article entitled "Silicon processing for the VLSI Era, Volume 1, Process technology", second Edition, S. Wolf; R. N Tauber, Lattice press, 2000, pages 391-397.

The recrystallisation stage includes a thermal treatment of the top layer.

In one example of implementation of the invention, this thermal treatment is applied at a temperature of 500° C. to 600° C. for between a few tens of seconds and several hours.

As an example, for a SiGe 20% layer of 500 angstroms in thickness, which has been amorphised as described above, recrystallisation of the whole thickness of the layer can be achieved after annealing at 500° C. for 14 hours or 550° C. for 0.7 hours, or indeed for 125 seconds at 600° C.

The thickness of the top layer can be between 500 angstroms and 3 microns.

The invention can be applied to the manufacture of a multilayer structure by the transfer of at least a part of the top layer 220 (manufactured as described above) onto a receiving substrate.

In such an application of the invention, a multilayer structure is created, whose surface layer comes from the top layer 220 or whose surface layer has been formed on the top layer 220;

In particular, the transfer can be effected using a method of the Smart-Cut™ type (reference can be made to document US 2004/0053477 or WO 2004/006311 for examples of such applications).

In this case, the amorphisation stage is performed so that the depth of the amorphisation interface in the top layer 220 is equal to or greater than the final thickness desired for the transferred layer.

In a variant, it is possible to choose the energy and the dose of the implanted species in the fragilisation stage of the Smart-Cut™ process, so as trap this species at or close to the network of defects 2201 created by implantation. In fact this allows the dose implanted during this stage of fragilising implantation to be limited, which typically allows one to obtain a reduced roughness after the fracture of the Smart-Cut™ process.

In the context of implementation of the invention for the manufacture of a multilayer structure by transfer of at least a part of the top layer 220, it is possible that the transferred layer may be thicker than layer 221 (in the case of transfer by a method of the Smart-Cut™ type for example, in which the fragilising implantation is effected through the whole thickness of layer 221, and constitutes a zone of fragilisation in the thickness of the layer 222).

In this case, the multilayer structure will be subjected to the finishing stages after transfer (by CMP, etching, or thermal treatment for example) in order to effect the removal of the residual zone 220 in the transferred part and thus to retain only the healthy zone (i.e. coming from layer 221) in the final structure.

By virtue of the invention, it is possible to obtain substrates that have a top layer in SiGe and an underlying transition layer in which the crosshatching is 2.4 angstroms RMS ("Root Mean Square" average roughness) and 17 angstroms PV ("Peak to Valley"), for a scanning zone (that is for a "scan") of 40*40 microns.

In such substrates, the density in the top layer is a few units of cm/cm2 for the pile-up and from $1^E4$ to $1^E5$ for the dislocations.

What is claimed is:

1. A process for reducing defects in an exposed surface layer of a substrate during its manufacture thereof, wherein the substrate comprises a top layer of a first material and an underlying layer of a second material whose lattice parameter is different from that of the first material, which process comprises:

conducting an amorphization of a first portion of the top layer to create an amorphous region in the top layer extending from an exposed surface of the top layer to an amorphization interface that is within the top layer, with a second portion of the top layer below the interface being shielded from the amorphization and remaining as a crystalline structure;

recrystallizing the amorphous region while also creating a network of defects at the interface, wherein the network forms a boundary for dislocations from the crystalline structure of the second top layer portion, and containing the dislocations in the second top layer portion that is located below the interface.

2. The process according to claim 1, wherein the amorphization interface is formed at a constant depth in the top layer.

3. The process according to claim 1, wherein the amorphization is effected by the implantation of species in the top layer.

4. The process according to claim 3, wherein the top layer is SiGe.

5. The process according to claim 4, wherein the implantation is achieved by implanting ions of Si or Ge.

6. The process according to claim 2, wherein the implantation includes several successive stages of implantation during which the implantation energy is reduced progressively.

7. The process according to claim 6, wherein the top layer comprises SiGe 20%, and the implantation is effected at ambient temperature and includes three stages of implantation effected with the following energies and doses:

stage 1: 250 keV/10E15, stage 2: 150 keV/5.10E14 stage 3: 50 keV/10E15.

8. The process according to claim 1, wherein the amorphization is achieved by exposure of the top layer to a pulsed laser beam.

9. The process according to claim 8, wherein laser beam provides pulses having a length of a few nanoseconds.

10. The process according to claim 1, wherein the amorphization is achieved by exposure of the top layer to electron radiation.

11. The process according to claim 1, wherein the recrystallizing includes a thermal treatment of the top layer.

12. The process according to claim 11, wherein the thermal treatment is conducted at a temperature of 500 to 600° C. for between a few tens of seconds and several hours.

13. The process according to claim 1, wherein the top layer comprises Ge.

14. The process according to claim 1, wherein the top layer has a thickness of between 500 angstroms and 3 microns.

15. A process for the manufacture of a multilayer structure which comprises forming a structure according to claim 1, and transferring at least a part of the top layer onto a receiving substrate to form the multilayer structure.

16. The process according to claim 15, wherein the transferring is performed by forming a zone of weakness in the top layer, bonding the top layer to the receiving substrate and detaching the part of the top layer at the zone of weakness to transfer it to the receiving substrate.

17. A process for reducing defects in an exposed surface layer of a substrate during its manufacture, wherein the substrate comprises a top layer of a first material and an underlying layer of a second material whose lattice parameter is different from that of the first material, which process comprises:

conducting an amorphization of a first portion of the top layer to create an amorphous region in the top layer extending from an exposed surface of the top layer to an amorphization interface that is within the top layer, with a second portion of the top layer below the interface being shielded from the amorphization and remaining as a crystalline structure;

recrystallizing the amorphous region while also creating a network of defects at the interface, wherein the network forms a boundary for dislocations from the crystalline structure of the second top layer portion;

containing the dislocations in the second top layer portion that is located below the interface; and transferring at least a part of the top layer onto a receiving substrate to form the multilayer structure, wherein the amorphization is carried out so that the depth of the amorphization interface in the top layer is equal to or greater than the final thickness desired for the transferred layer such that the transferred layer is free of such dislocations.

18. The process according to claim 4, wherein the recrystalized top layer portion has a crosshatching of 2.4 angstroms RMS and 17 angstroms PV for a scanning zone of 40*40 microns.

19. The process according to claim 4, wherein the recrystalized first top layer portion has a density of a few units of cm/cm2 for the pile-up and 1E4 to 1E5 for the dislocations.

20. The process according to claim 17, wherein the transferring is performed by forming a zone of weakness in the top layer at the level of the amorphization interface, bonding the top layer to the receiving substrate after recrystallizing, and detaching the part of the top layer at the zone of weakness to transfer it to the receiving substrate.

* * * * *